United States Patent
Sugiyama et al.

(10) Patent No.: US 6,727,571 B2
(45) Date of Patent: Apr. 27, 2004

(54) INDUCTOR AND METHOD FOR ADJUSTING THE INDUCTANCE THEREOF

(75) Inventors: Yuji Sugiyama, Yokohama (JP); Yoshiyuki Tonami, Machida (JP); Masahiko Kawaguchi, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/290,404

(22) Filed: Nov. 8, 2002

(65) Prior Publication Data

US 2003/0098496 A1 May 29, 2003

(30) Foreign Application Priority Data

Nov. 26, 2001 (JP) .......................... 2001-359405

(51) Int. Cl.$^7$ .............................................. H01L 29/00
(52) U.S. Cl. ...................................... 257/531; 257/528
(58) Field of Search ................................ 257/256, 272, 257/274, 275, 277, 368, 379, 499, 516, 528

(56) References Cited

U.S. PATENT DOCUMENTS 6,143,614 A * 11/2000 Nasserbakht
6,169,320 B1 * 1/2001 Stacey
6,455,885 B1 * 9/2002 Lin

FOREIGN PATENT DOCUMENTS

| EP | 1085538 A1 * | 3/2001 |
|---|---|---|
| JP | 4-63618 | 5/1992 |
| JP | 8-186461 | 7/1996 |
| JP | 2001-85230 | 3/2001 |

* cited by examiner

*Primary Examiner*—Kevin Quinto
(74) *Attorney, Agent, or Firm*—Keating & Bennett, LLP (57) ABSTRACT

A spiral coil pattern is formed on a substantially rectangular insulation substrate of an inductor by photolithography. In the coil pattern, the electrode width of a portion of the pattern provided in the vicinity of the right short side of the substrate so as to be substantially parallel to the short side is wider than the electrode width of the other portion of the pattern. The interelectrode spacing of a portion of the pattern is wider than the interelectrode spacing of the other portion of the pattern. When the inductance of the inductor is required to be reduced to make the inductance a desired inductance value, the electrode width of the portion of the coil pattern is made wider in the inner direction of the coil pattern than the original electrode width.

20 Claims, 6 Drawing Sheets

INDUCTOR AND METHOD FOR ADJUSTING THE INDUCTANCE THEREOF

BACKGROUND OF THE INVENTION

1. Field of the Invention

The present invention relates to an inductor, more particularly, to an inductor for use in, for example, high-frequency circuits and other such apparatuses, and to a method for adjusting the inductance value of an inductor.

2. Description of the Related Art

Through the miniaturization of mobile communication devices such as portable telephone terminals, etc., the demands for size reductions of electronic components used in these mobile communication devices are great. As a result, the inductance value of related lamination type inductors has been adjusted such that the pattern width of all of the portions of one or more coil patterns out of the coil patterns of several layers is uniformly made wider or narrower.

Figure 8A:
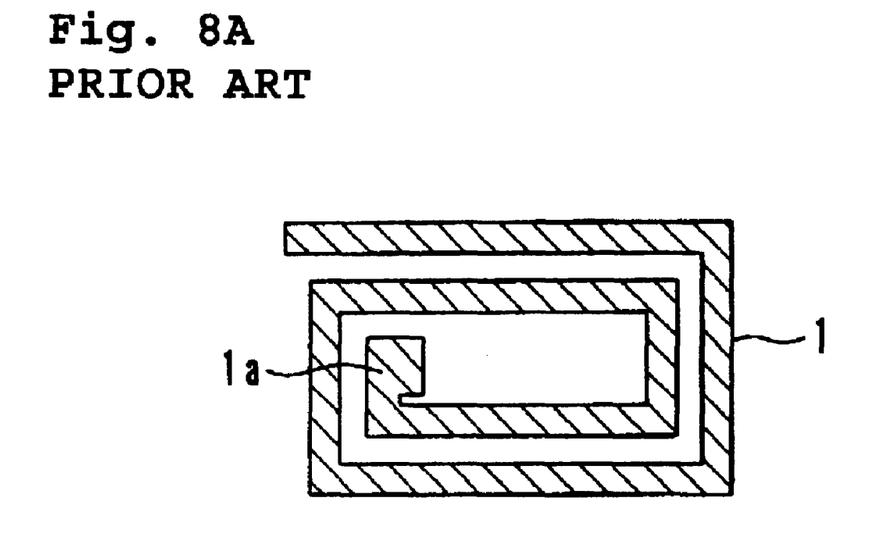
FIG. 8 is a top view for describing a related method for adjusting an inductance value.

Here, when the size of lamination type inductors is even more reduced and the pattern width becomes finer, as shown in FIG. 8A, a coil pattern 1 having several turns is often formed on the same layer. In such a case, if the pattern width of the coil pattern 1 is made wider with reference to the center of the pattern in order to adjust the inductance value, the size of the coil pattern 1 on the same layer increases and this becomes an obstacle to size reductions of the inductors.

Figure 8B:
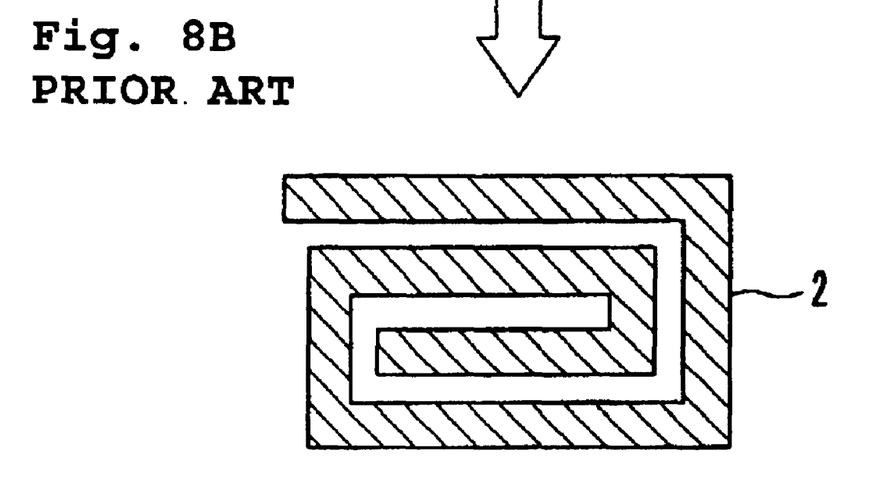

Then, if the pattern width is made wider in the inner direction of the coil pattern 1 in order to prevent the size of the coil pattern 1 on the same layer from increasing, as shown in FIG. 8B, a coil pattern 2 having a smaller inner diameter will be produced. The inductor having such a coil pattern 2 exhibited bad Q characteristics.

Furthermore, in the direction of the short side where the inner diameter is small, it was difficult to obtain an area in which a via pad 1a (see FIG. 8A) for connection between layers is disposed as a portion of the coil pattern.

SUMMARY OF THE INVENTION

In order to solve the problems described above, preferred embodiments of the present invention provide a much smaller inductor in which the degradation of Q characteristics is prevented, and a method for adjusting the inductance value of such a novel inductor.

According to a preferred embodiment of the present invention, an inductor includes a substantially rectangular insulation substrate and at least one coil pattern made of photolithographic material disposed on the insulation substrate, the at least one coil defining a spiral on the surface of the insulation substrate, and, in the coil pattern of the inductor, the electrode width and interelectrode spacing of a portion of the pattern provided in the vicinity of at least one short side of the two short sides of the substantially rectangular insulation substrate and arranged so as to be substantially parallel to the short side is wider than the electrode width of the other portion of the pattern. For example, the electrode width and interelectrode spacing of the portion of the pattern provided in the vicinity of the long side of the insulation substrate is arranged so as to be substantially parallel to the long side.

Furthermore, in a method for adjusting the inductance value of an inductor including a substantially rectangular insulation substrate and at least one coil pattern that is formed via photolithography, which defines a spiral on the surface of the insulation substrate, the inductance value is adjusted by increasing or decreasing the electrode width and interelectrode spacing of a portion of the pattern provided in the vicinity of at least one short side of two short sides of the substantially rectangular insulation substrate so as to be substantially parallel to the short side. Or the inductance value is increased by decreasing the electrode width and interelectrode spacing of a portion of the pattern provided in the vicinity of at least one long side of the insulation substrate so as to be substantially parallel to the long side.

Here, the expression of a coil pattern defining a spiral on the surface of an insulation substrate includes not only a coil pattern formed on the upper surface of the insulation substrate, but also a coil pattern formed above the insulation substrate through an insulation layer, or other suitable configuration.

When constructed as described above, fine adjustment of the inductance value becomes possible in an electronic component of a limited size and the degradation of Q characteristics is prevented and minimized.

Other elements, features, characteristics and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of an inductor and a method for adjusting the inductance value thereof according to the present invention are described with reference to the accompanying drawings.

Figure 1:
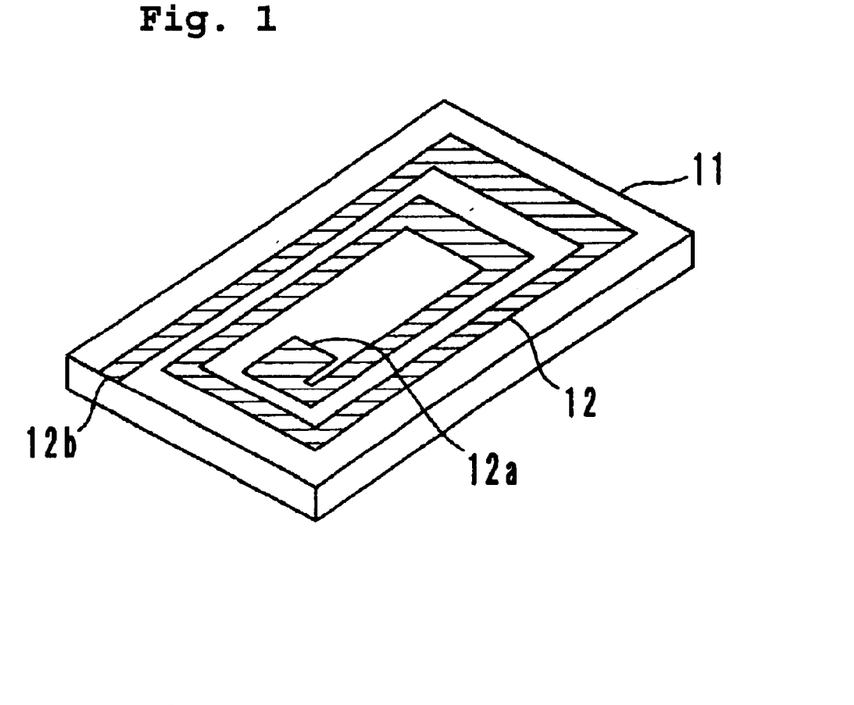
FIG. 1 is a perspective view showing a preferred embodiment of an inductor according to the present invention.

The coil pattern of an inductor according to a preferred embodiment of the present invention is preferably formed via photolithography. As shown in FIG. 1, after the upper surface of a substantially rectangular insulation substrate 11 has been polished to produce a smooth surface, a film of conductive material is formed on the entire upper surface of the insulation substrate 11 by using a thin film forming method such as sputtering, evaporation, or other suitable process, or a thin film forming method such as screen printing, or other suitable process, or other suitable method. Next, a spiral coil pattern 12 is formed on the upper surface of the insulation substrate 11 preferably by using a method of photolithography. The electrode thickness of the coil pattern 12 is preferably in the range of, for example, about 8 μm to about 12 μm. Moreover, after an insulation material has been formed on the upper surface of the insulation substrate, a coil pattern may be formed on the upper surface.

The photolithography process is, for example, described below. A photoresist film (for example, a photosensitive resin film, or other suitable film) is spin coated or printed on the entire surface of a film of conductive material formed on the upper surface of the insulation substrate 11. Next, the surface of the photoresist film is covered by a masking film having a fixed image pattern formed therein and a fixed portion of the photoresist film is hardened by ultraviolet irradiation, or other suitable process. Next, after the photoresist film has been peeled away leaving the hardened portion, the exposed portion of the film of conductive material is removed by etching to form a desired coil pattern 12. After that, the hardened photoresist film is removed. Then, in a method using what is called a photolithographic technology, well known methods of wet etching, dry etching, lift off, use of additives, or other suitable processes, may be appropriately adopted.

Furthermore, as another photolithography process, a method, in which a film of conductive material is formed on the upper surface of the insulation substrate 11 by coating a paste of photosensitive conductor material and then the film covered by a masking film having a fixed image pattern formed therein is exposed to light and developed, may be used. In particular, when the paste of photosensitive conductor material is used, fine processing becomes possible while a thick film of conductor material is used. As a result, low loss performance is assured in preferred embodiments of the present invention. Furthermore, the spacing between electric lines can be made narrower.

In the spiral coil pattern 12, a via pad 12a for connection between layers at one end of the coil pattern 12 is located in the inner portion of the spiral pattern, and the end portion 12b at the other end is located on the outer side of the spiral pattern to be exposed to the left. Glass, glass-ceramics, alumina, ferrite, Si, $SiO_2$, or other suitable material, are used as a material for the insulation substrate 11. A paste of conductor material and a paste of photosensitive conductive material including, for example, Cu, Au, Ag, Pg—Pd, or other suitable material, are used as a material for the coil pattern 12.

Figure 2:
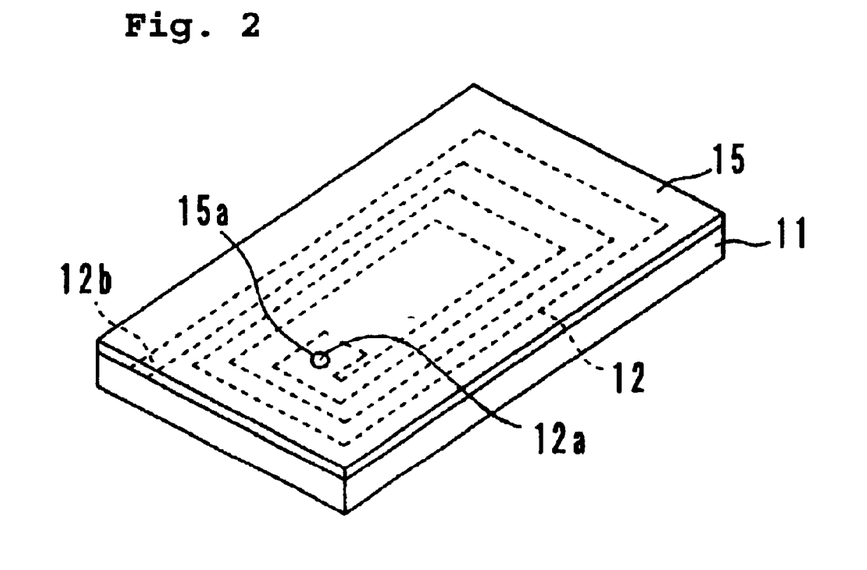
FIG. 2 is a perspective view for describing the manufacturing steps following the steps described with reference to FIG. 1.

Next, as shown in FIG. 2, an insulation layer 15 having an opening 15a is formed. The insulation layer 15 is formed such that a liquid insulation material is coated on the entire upper surface of the insulation substrate 11 by spin coat, printing, or other suitable process, and then dried, and baked. As the insulation material, for example, a photosensitive polyimide resin, a photosensitive glass paste, or other suitable material, are used. When common polyimide resins and glass pastes are used, it is necessary to form a resist layer and process the resist layer in order to form (produce) a desired pattern. However, if the photosensitive polyimide resin or the photosensitive glass paste is used, since the photosensitive material coated on the entire surface can be directly processed, the process of coating the resist and peeling the resist off can be omitted and, as a result, the pattern can be effectively formed.

Next, the upper surface of the insulation layer 15 is covered by a masking film having a fixed image pattern formed therein and a desired portion of the insulation layer 15 is hardened by ultraviolet irradiation, or other suitable process. Next, the not-hardened portion of the insulation layer 15 is removed to form an opening 15a. The via pad 12a for connection between layers of the spiral coil pattern 12 is exposed in the opening 15a.

Figure 3:
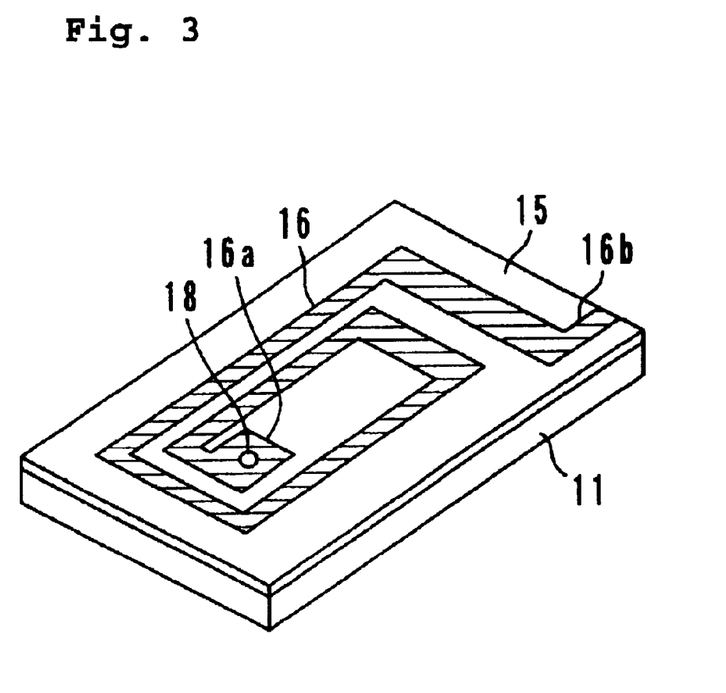
FIG. 3 is a perspective view for describing the manufacturing steps following the steps described with reference to FIG. 2.

Next, as shown in FIG. 3, a spiral coil pattern 16 made of a conductive material is preferably formed in the same way as the coil pattern 12, etc., are formed, that is, by a photolithographic method. The opening 15a of the insulation layer 15 is filled with a conductive material, which is to be made a via hole 18. Moreover, the uppermost coil pattern 16 is not necessarily required to be have a spiral shape and may be linearly extended from the location of the via pad 12a to the right side of the insulation substrate 11.

One end 16a of the coil pattern 16 is electrically connected to the via pad 12a for connection between layers of the coil pattern 12 through the via hole 18. The other end 16b of the coil pattern 16 is exposed at the right side of the insulation substrate 11. The number of turns of the coil pattern 12 may be different from that of the coil pattern 16 and the inner diameter of both may also be different from each other.

Figure 4:
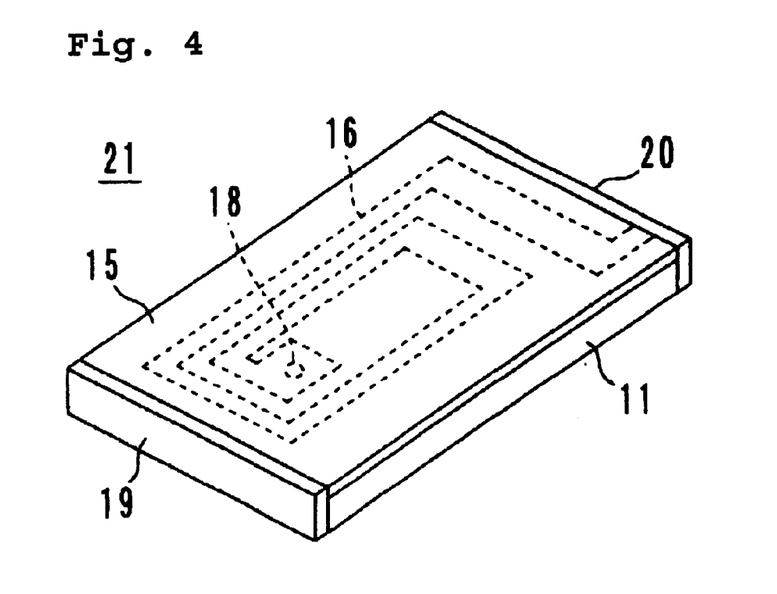
FIG. 4 is a perspective view for describing the manufacturing steps following the steps described with reference to FIG. 3.

Next, as shown in FIG. 4, a liquid insulation material is coated on the entire upper surface of the insulation substrate 11 by spin coat, printing, or other suitable process, and then is dried, and baked to form the insulation layer 15 covered with the coil pattern 16.

Next, external input and output electrodes 19 and 20 are provided on the left and right sides of the insulation substrate 11. The external input electrode 19 is electrically connected to the end 12b of the coil pattern 12 and the external output electrode 20 is electrically connected to the end 16b of the coil pattern 16. The external electrodes 19 and 20 are formed such that a conductive paste made of Ag, Ag—Pd, Cu, NiCr, NiCu, Ni, or other suitable material, is coated and baked and then a metal film of Ni, Sn, Sn—Pb, or other suitable material, is formed by electrolytic plating and also the external electrodes 19 and 20 are formed by sputtering, evaporation, printing, photolithography, or other suitable process.

Figure 5A:
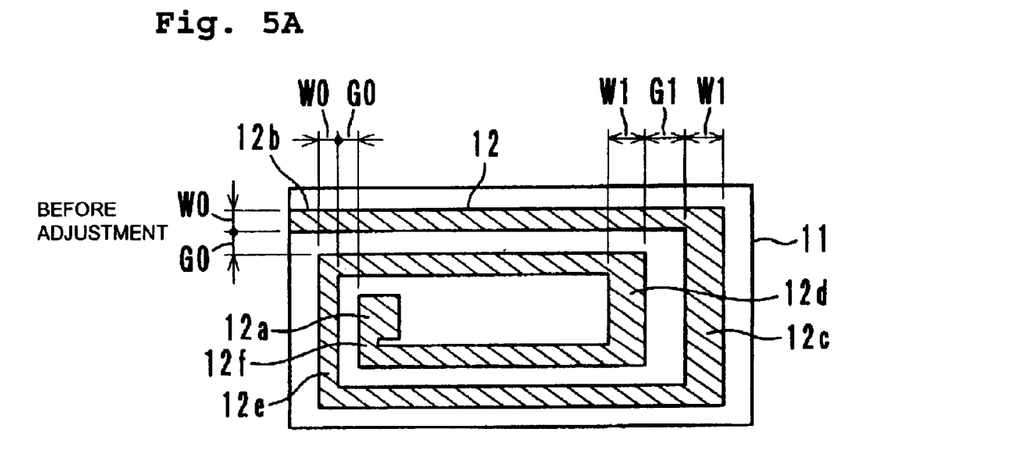
FIGS. 5A to 5C are top views for describing one example of a method for adjusting an inductance value according to a preferred embodiment of the present invention.

Next, a method for adjusting the inductance value of the inductor 21 is described. As shown in FIG. 5A, the coil pattern 12 is formed on the substantially rectangular insulation substrate 11 (in the present preferred embodiment, the ratio of long side to short side is preferably about 2 to 1, and they have specific dimensions of, for example, approximately 0.6 mm×0.3 mm or 1.0 mm×0.5 mm). Regarding the coil pattern 12 (the electrode width is in the range of about 15 μm to about 30 μm and the interelectrode spacing is in the range of about 15 μm to about 25 μm), the electrode width W1 of the portions 12c and 12d of the pattern, which are provided in the vicinity of the right short side of the substrate 11 so as to be substantially parallel to the short side, are wider than the electrode width W0 of the other portion of the coil pattern 12. In the present preferred embodiment, the electrode width W1 is preferably about 25 μm and the electrode width W0 is preferably about 15 μm. Furthermore, the interelectrode spacing G1 in the portions 12c and 12d of the pattern is preferably wider than the interelectrode spacing G0 in the other portions. The coil pattern 16 is also preferably designed in the same way. In the present preferred embodiment, the interelectrode spacing G1 is about 25 μm and the interelectrode spacing G0 is about 15 μm.

Figure 5B:
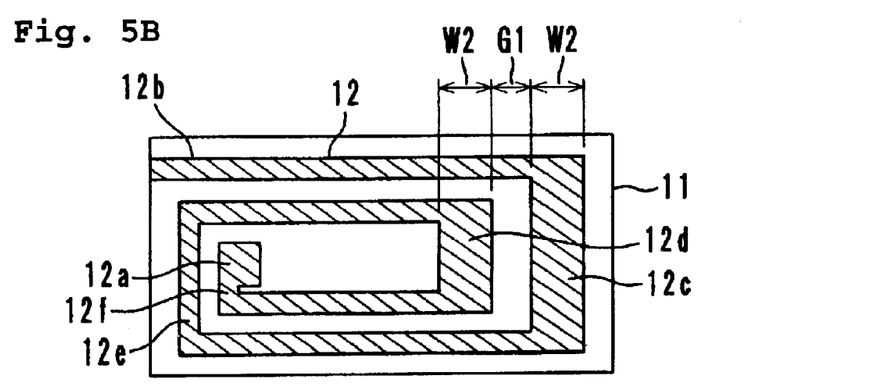

Then, when the inductance of the inductor 21 is needed to be reduced in order to make it closer to a desired inductance value, as shown in FIG. 5B, the inductance value is adjusted such that the electrode width W2 of the portions 12c and 12d of the coil pattern 12 is wider in the inner portion of the coil pattern 12 than the width W1. However, the interelectrode spacing G1 is not changed. It is desirable to make the electrode width W2 about 1.5 to about 2.5 times larger than the electrode width W0 of the other portions. If the electrode width W2 is narrower than about 1.5 times the electrode width W0, the inductance changes only a little and the inductance value can not be effectively adjusted. On the other hand, if the electrode width W2 is wider than about 2.5 times the electrode width W0, in the insulation substrate 11 in which the ratio of the long side to the short side is preferably about 2 to 1, the inner diameter in the direction of long side of the coil pattern 12 becomes smaller than the inner diameter in the direction of short side and accordingly the effect of preferred embodiments of the present invention, in which the inner diameter is not restrictive, cannot be obtained.

Figure 5C:
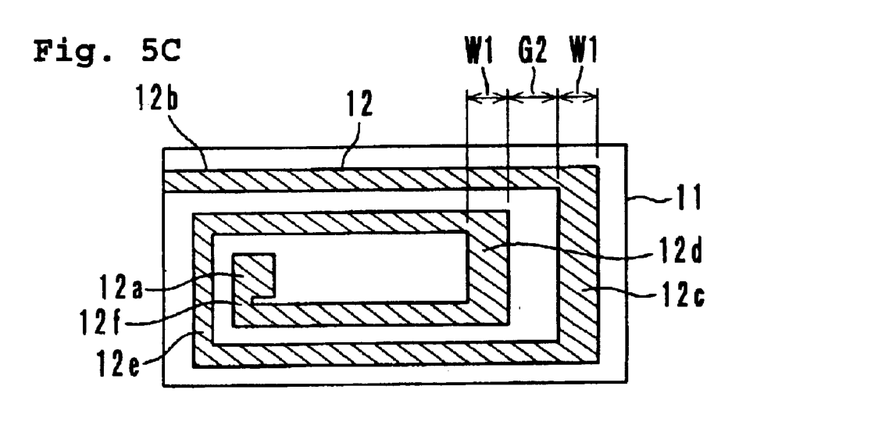

Furthermore, when the inductance of the inductor 21 is needed to be reduced, as shown in FIG. 5C, the inductance value may be adjusted such that the interelectrode spacing G2 in the portions 12c and 12d of the coil pattern 12 is wider than the space G1 in the inner direction of the coil pattern 12. However, the electrode width is not changed. It is preferable that the interelectrode spacing is about 1.5 to about 2.5 times the interelectrode spacing G0 of the other portions.

Moreover, in FIGS. 5B and 5C, although only the electrode width and interelectrode spacing of the portions 12c and 12d arranged to be substantially parallel to the right short side are changed, if the inductance value cannot be sufficiently adjusted by these changes, the inductance value is adjusted such that the electrode width and interelectrode width of the portions 12e and 12f provided in the vicinity of the left short side of the substrate 11 so as to be substantially parallel to the short side are made larger. If the inductance value is still not fully adjusted, the electrode width and interelectrode spacing of the same portions in the coil pattern 16 are made larger.

In this way, in the coil pattern 12, since the electrode width and interelectrode spacing of only the portions 12c to 12f of the pattern provided in the vicinity of the short sides of the substrate 11 so as to be substantially parallel to the short sides are made larger in the inner portion of the coil pattern 12, fine adjustment of the inductance value is possible in an electronic component having a limited size. That is, the inductance value can be adjusted while the area for forming the via pads 12a and 16a for connection between layers is reliably provided. Furthermore, regarding the inner diameter of the coil pattern 12, the inner diameter in the direction of the short side where the space is narrow is not changed before and after the adjustment of the inductance value, the degradation of Q characteristics can be minimized. Moreover, since the electrode width and interelectrode spacing of the portions 12c to 12f of the portion are made wider, conditions for fine processing of the coil pattern 12 are simplified and the manufacturing cost can be reduced. Furthermore, when the electrode width or the interelectrode spacing of the portions 12c and 12d or the portions 12e and 12f of the portion, that is, either left or right side of the coil pattern 12 is changed, it becomes easy to distinguish the direction of the inductor 231.

Figure 6A:
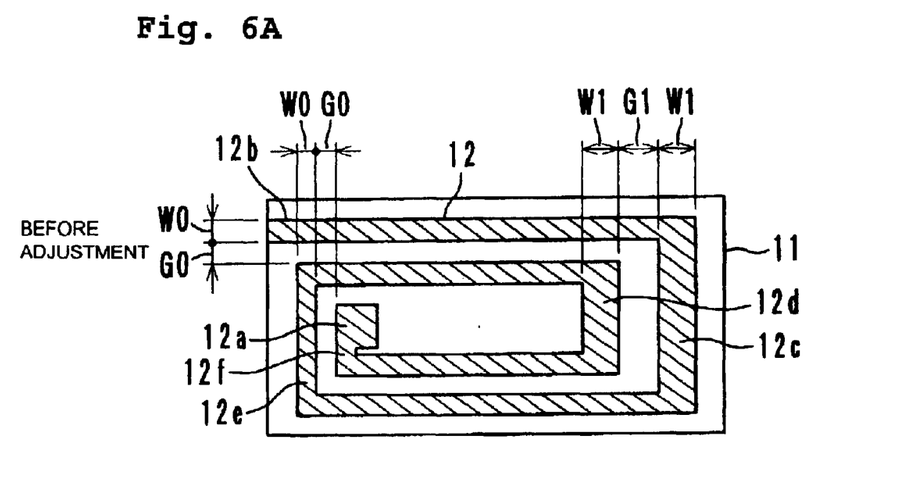
FIGS. 6A to 6C are top views for describing another example of a method for adjusting an inductance value according to a preferred embodiment of the present invention.
Figure 6B:
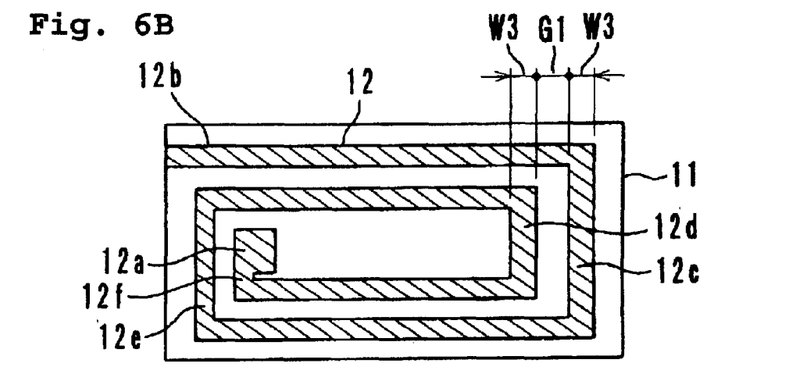
Figure 6C:
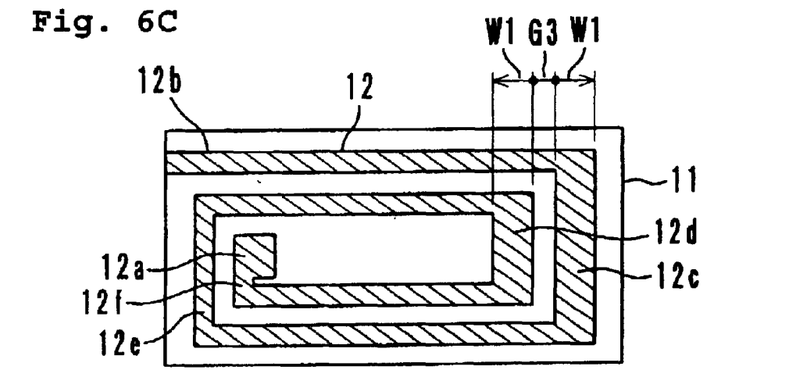

On the other hand, when the inductance of the inductor 21 is required to be increased, as shown in FIG. 6B, the electrode width of the portions 12c and 12d of the coil pattern 12 is made narrower in the outer direction and the electrode width W3, which is smaller than the electrode width W1, is set to adjust the inductance value. However, the interelectrode spacing G1 is not changed. Alternatively, as shown in FIG. 6C, the interelectrode spacing of the portions 12c and 12d of the coil pattern 12 is made narrower and the electrode width G3, which is narrower than the electrode width G1, is set to adjust the inductance value. However, the electrode width W1 is not changed. If the inductance value cannot be fully adjusted by these measures, the electrode width and interelectrode spacing of the portions 12e and 12f of the pattern provided in the vicinity of the left side of the substrate 11 so as to be substantially parallel to the short side are made narrower to adjust the inductance value. If the inductance value is still not fully adjusted by this, the electrode width and interelectrode spacing of the same portions of the coil pattern 16 are made narrower to adjust the inductance value.

Figure 7A:
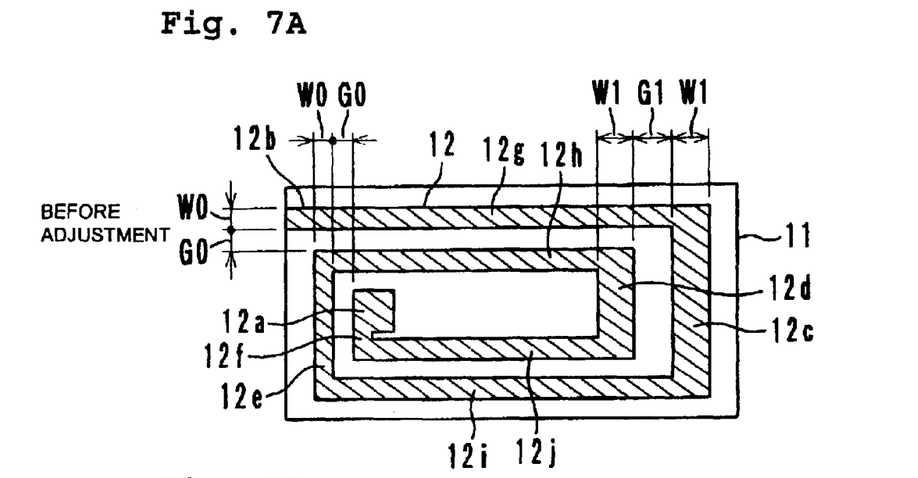
FIGS. 7A to 7C are top views for describing another example of a method for adjusting an inductance value according to a preferred embodiment of the present invention.
Figure 7B:
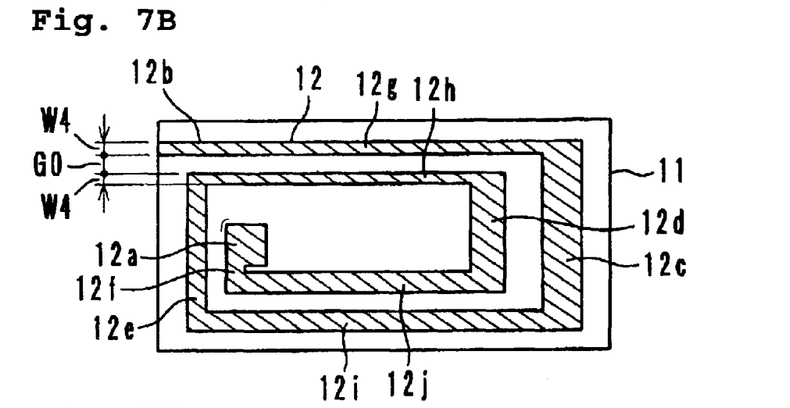

Furthermore, when the inductance of the inductor 21 is required to be increased, as shown in FIG. 7B, the electrode width of the portions 12g and 12h of the pattern provided in the vicinity of the upper long side of the substrate 11 so as to be substantially parallel to the long side may be made narrower and the electrode width W4, which is narrower than the electrode width W1, is set to adjust the inductance value. However, the interelectrode spacing G0 is not changed. It is preferable that the electrode width W4 is about $2/5$ to about $2/3$ times the electrode width W0.

Figure 7C:
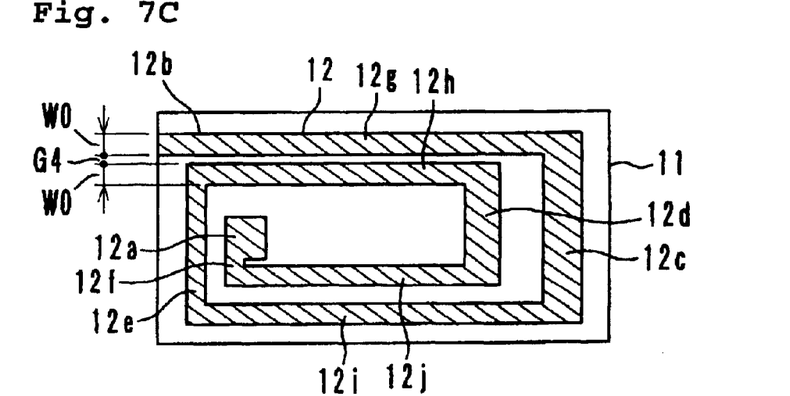

Furthermore, when the inductance of the inductor 21 is required to be increased, as shown in FIG. 7C, the interelectrode spacing of the portions 12g and 12h of the coil pattern 12 may be made narrower and the interelectrode spacing G4 is preferably narrower than the interelectrode spacing G0 to adjust the inductance value. However, the electrode width W0 is not changed. It is preferable that the interelectrode spacing G4 is about $2/5$ to about $2/3$ times the interelectrode spacing W0.

Moreover, in FIGS. 7B and 7C, although only the electrode width and interelectrode spacing of the portions 12g and 12h of the pattern provided in the vicinity of the upper long side of the substrate so as to be substantially parallel to the long side are changed, if the inductance value cannot be fully adjusted by these changes, the electrode width and interelectrode spacing of the portions of the pattern provided in the vicinity of the lower long side of the substrate 11 so as to be parallel to the long side are made narrower to adjust the inductance value. If the inductance value still is not fully adjusted by these measures, the electrode width and interelectrode spacing of the portions 12c to 12f of the pattern provided in the vicinity of the short sides of the substrate 11 are made narrower and, moreover, the electrode width and interelectrode spacing of the same portions of the coil pattern 16 are made narrower to adjust the inductance value.

In this way, in the coil pattern 12, fine adjustment of the inductance value can be easily made merely by making narrower the electrode width and interelectrode spacing of the portions 12h to 12j of the pattern provided in the vicinity of the long sides of the substrate 11 so as to be substantially parallel to the long sides. Furthermore, regarding the inner diameter of the coil pattern 12, the inner diameter having a greater dimension in the direction of the long sides is not changed before and after the adjustment of the inductance value, and the inner diameter having a narrow dimension in the direction of the short sides can be made wider as much as the electrode width and others of the portions 12h to 12j of the pattern are made narrower, and accordingly the Q characteristics is not deteriorated.

Moreover, the present invention is not limited to the above-described preferred embodiments and the preferred embodiments can be variously modified within the true spirit and scope of the invention.

In the above-described preferred embodiments, although the individual production of each unit is described as an example, when mass-produced, it is effective to produce a mother board (wafer) including a plurality of inductors and cut the mother board into each individual unit at the final stage of production by using a method of dicing, scribe and break, laser cutting, or other suitable processes.

Moreover, the inductor may be constructed by forming a coil pattern directly on a printed board at a location where a circuit pattern is formed. Furthermore, the shape of the coil pattern is arbitrary and may be have a zigzag line shape or other suitable shape, besides having a spiral shape as described above with reference to preferred embodiments of the present invention.

Furthermore, the inductor in the above-described preferred embodiments is preferably made of coil patterns having two layers, but it is a matter of course that, as required, the inductor may be made of a coil pattern having one layer or coil patterns having three or more layers. When a multi-layer construction of two or more layers is used, the line length of the coil pattern can be lengthened and a much higher inductance can be obtained.

As clearly understood in the above description, according to preferred embodiments of the present invention, fine adjustment of the inductance value becomes possible in an electronic component having a limited size and the degradation of Q characteristics can be minimized.

Furthermore, since the coil pattern is formed by using a technique of photolithography, when compared with a method of screen printing, variations of the pattern thickness and pattern width are reduced and excellent repeatability is achieved, and accordingly, the inductance value can be adjusted with a high degree of precision.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An inductor comprising:
    a substantially rectangular insulation substrate; and
    at least one coil pattern disposed on the insulation substrate;
    wherein an electrode width of a portion of the at least one coil pattern provided in the vicinity of at least one short side of two short sides of the substantially rectangular insulation substrate is wider than an electrode width of a portion of the at least one coil pattern which is directly connected to the portion provided in the vicinity of the at least one short side; and
    an interelectrode spacing of the portion of the at least one coil pattern provided in the vicinity of at least one short side of two short sides of the substantially rectangular insulation substrate is wider than an interelectrode spacing of the portion of the at least one coil pattern which is directly connected to the portion provided in the vicinity of the at least one short side.

2. The inductor according to claim 1, wherein the coil pattern has a spiral shape.

3. The inductor according to claim 1, wherein an interelectrode spacing of a portion of the pattern provided in the vicinity of at least one short side of two short sides of the substantially rectangular insulation substrate so as to be substantially parallel to the short side is wider than an interelectrode spacing of the other portion of the pattern.

4. The inductor according to claim 1, wherein the at least one coil pattern has one of a one layer construction, a two layer construction and an at least three layer construction.

5. An inductor comprising:
    a substantially rectangular insulation substrate; and
    at least one coil pattern disposed on the insulation substrate and made of photolithographic material;
    wherein an electrode width of a portion of the at least one coil pattern provided in the vicinity of at least one short side of two short sides of the substantially rectangular insulation substrate is wider than an electrode width of a portion of the at least one coil pattern which is directly connected to the portion provided in the vicinity of the at least one short side; and
    an interelectrode spacing of the portion of the at least one coil pattern provided in the vicinity of at least one short side of two short sides of the substantially rectangular insulation substrate is wider than an interelectrode spacing of the portion of the at least one coil pattern which is directly connected to the portion provided in the vicinity of the at least one short side.

6. The inductor according to claim 5, wherein the coil pattern has a spiral shape.

7. The inductor according to claim 5, wherein an electrode width of a portion of the pattern provided in the vicinity of at least one short side of two short sides of the substantially rectangular insulation substrate so as to be substantially parallel to the short side is wider than an electrode width of the other portion of the pattern.

8. The inductor according to claim 5, wherein the at least one coil pattern has one of a one layer construction, a two layer construction and an at least three layer construction.

9. A method for adjusting the inductance value of an inductor comprising a substantially rectangular insulation substrate and at least one coil pattern formed by photolithography, wherein, in the coil pattern, the inductance value is adjusted by increasing or decreasing the electrode width of a portion of the pattern provided in the vicinity of at least one short side of the substantially rectangular insulation substrate so as to be substantially parallel to the short side.

10. The method to claim 9, wherein the at least one coil pattern has a spiral configuration.

11. The method according to claim 9, wherein the at least one coil pattern has one of a one layer construction, a two layer construction and an at least three layer construction.

12. A method for adjusting the inductance value of an inductor comprising a substantially rectangular insulation substrate and at least one coil pattern formed by photolithography, wherein, in the coil pattern, the inductance value is adjusted by increasing or decreasing the interelectrode spacing of a portion of the pattern provided in the vicinity of at least one short side of the substantially rectangular insulation substrate so as to be substantially parallel to the short side.

13. The method according to claim 12, wherein the coil pattern has a spiral configuration.

14. The method according to claim 12, wherein the at least one coil pattern has one of a one layer construction, a two layer construction and an at least three layer construction.

15. A method for adjusting the inductance value of an inductor comprising a substantially rectangular insulation substrate and at least one coil pattern formed by photolithography, wherein, in the coil pattern, the inductance value is increased by decreasing the electrode width of a portion of the pattern provided in the vicinity of at least one long side of the substantially rectangular insulation substrate so as to be substantially parallel to the long side.

16. The method according to claim 15, wherein the coil pattern has a spiral configuration.

17. The method according to claim 15, wherein the at least one coil pattern has one of a one layer construction, a two layer construction and an at least three layer construction.

18. A method for adjusting the inductance value of an inductor comprising a substantially rectangular insulation substrate and at least one coil pattern formed by photolithography, wherein, in the coil pattern, the inductance value is increased by decreasing the interelectrode spacing of a portion of the pattern provided in the vicinity of at least one long side of the substantially rectangular insulation substrate so as to be substantially parallel to the long side.

19. The method according to claim 18, wherein the coil pattern has a spiral configuration.

20. The method according to claim 18, wherein the at least one coil pattern has one of a one layer construction, a two layer construction and an at least three layer construction.

* * * * *